(12) United States Patent
Cosgrove et al.

(10) Patent No.: US 11,116,090 B2
(45) Date of Patent: Sep. 7, 2021

(54) ELECTRONIC DEVICES INCORPORATING FLEXIBLE COMPONENT LAYERS WITH INTERLOCKING DEVICES

(71) Applicant: 3M INNOVATIVE PROPERTIES COMPANY, St. Paul, MN (US)

(72) Inventors: Dylan T. Cosgrove, Oakdale, MN (US); Catherine A. Leatherdale, Woodbury, MN (US); Fay T. Salmon, Eden Prairie, MN (US); Jun Fujita, Tokyo (JP); Albert I. Everaerts, Tucson, AZ (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 16/464,634

(22) PCT Filed: Nov. 22, 2017

(86) PCT No.: PCT/US2017/062994
§ 371 (c)(1),
(2) Date: May 28, 2019

(87) PCT Pub. No.: WO2018/102215
PCT Pub. Date: Jun. 7, 2018

(65) Prior Publication Data
US 2019/0380217 A1    Dec. 12, 2019

Related U.S. Application Data

(60) Provisional application No. 62/428,783, filed on Dec. 1, 2016.

(51) Int. Cl.
*H05K 5/02* (2006.01)
*F16B 1/00* (2006.01)
(Continued)

(52) U.S. Cl.
CPC .............. *H05K 5/0208* (2013.01); *F16B 1/00* (2013.01); *H05K 5/0017* (2013.01);
(Continued)

(58) Field of Classification Search
None
See application file for complete search history.

(56) References Cited

U.S. PATENT DOCUMENTS

| 5,077,870 A | 1/1992 | Melbye |
| 5,845,375 A | 12/1998 | Miller |

(Continued)

FOREIGN PATENT DOCUMENTS

| EP | 1609383 | 12/2005 |
| EP | 2705530 | 3/2014 |

(Continued)

OTHER PUBLICATIONS

International Search Report for PCT International Application No. PCT/US2017/062994, dated Mar. 8, 2018, 6 pages.

*Primary Examiner* — James Wu
*Assistant Examiner* — Christopher L Augustin
(74) *Attorney, Agent, or Firm* — Michael Stern

(57) ABSTRACT

Electronic Devices Incorporating Flexible Component Layers with Interlocking Devices At least some aspects of the present disclosure directs to an electronic device 100 comprising a rigid member 100A, 100B, a flexible component layer 130, and an interlocking device 110A, 110B disposed between the flexible component layer and the rigid member. The flexible component layer has at least two sections when the flexible component layer is flexed. The interlocking device comprises a first interlocking component attached to or integrated with the flexible component layer, and a second interlocking component attached to or integrated with the rigid member configured to engage with the first interlock- (Continued)

ing component, such that the engagement prevents the separation of the flexible component layer from the rigid member along a direction generally perpendicular to a surface of the rigid member.

11 Claims, 12 Drawing Sheets

(51) Int. Cl.
    *H05K 5/00*          (2006.01)
    *H05K 7/20*          (2006.01)

(52) U.S. Cl.
    CPC ....... *H05K 5/0226* (2013.01); *H05K 7/20963* (2013.01); *F16B 2001/0028* (2013.01)

(56) References Cited

U.S. PATENT DOCUMENTS

| | | | |
|---|---|---|---|
| 5,868,987 | A | 2/1999 | Kampfer |
| 6,357,128 | B1 | 3/2002 | Iden |
| 6,546,604 | B2 * | 4/2003 | Galkiewicz ........ A44B 18/0053 24/306 |
| 6,588,074 | B2 | 7/2003 | Galkiewicz |
| 7,603,775 | B2 | 10/2009 | Meng |
| 8,237,165 | B2 | 8/2012 | Kim |
| 8,263,731 | B2 | 9/2012 | Liu |
| 2004/0183958 | A1 * | 9/2004 | Akiyama ................. G09F 9/30 349/58 |
| 2006/0098411 | A1 | 5/2006 | Lee |
| 2009/0233465 | A1 | 9/2009 | Mizoguchi |
| 2010/0308335 | A1 | 12/2010 | Kim |
| 2012/0243207 | A1 | 9/2012 | Wang |
| 2014/0111954 | A1 | 4/2014 | Lee |
| 2014/0355195 | A1 * | 12/2014 | Kee ....................... G06F 1/1652 361/679.27 |
| 2015/0241925 | A1 | 8/2015 | Seo |
| 2015/0328803 | A1 * | 11/2015 | Burns ................ B29C 33/3857 264/482 |
| 2015/0330614 | A1 | 11/2015 | Lee |
| 2016/0155965 | A1 * | 6/2016 | Kusuura ............. H01L 51/0024 361/749 |
| 2016/0212890 | A1 * | 7/2016 | Jeong ...................... G09F 9/301 |
| 2016/0270217 | A1 * | 9/2016 | Park ........................... C09J 7/00 |
| 2016/0295709 | A1 * | 10/2016 | Ahn ..................... H05K 5/0017 |
| 2017/0068275 | A1 * | 3/2017 | Lee ....................... G06F 1/1652 |
| 2017/0192460 | A1 * | 7/2017 | Watanabe ................ G09F 9/00 |

FOREIGN PATENT DOCUMENTS

| | | |
|---|---|---|
| WO | WO 2016-196736 | 12/2016 |
| WO | WO 2019-018251 | 1/2019 |
| WO | WO 2019-018253 | 1/2019 |

\* cited by examiner

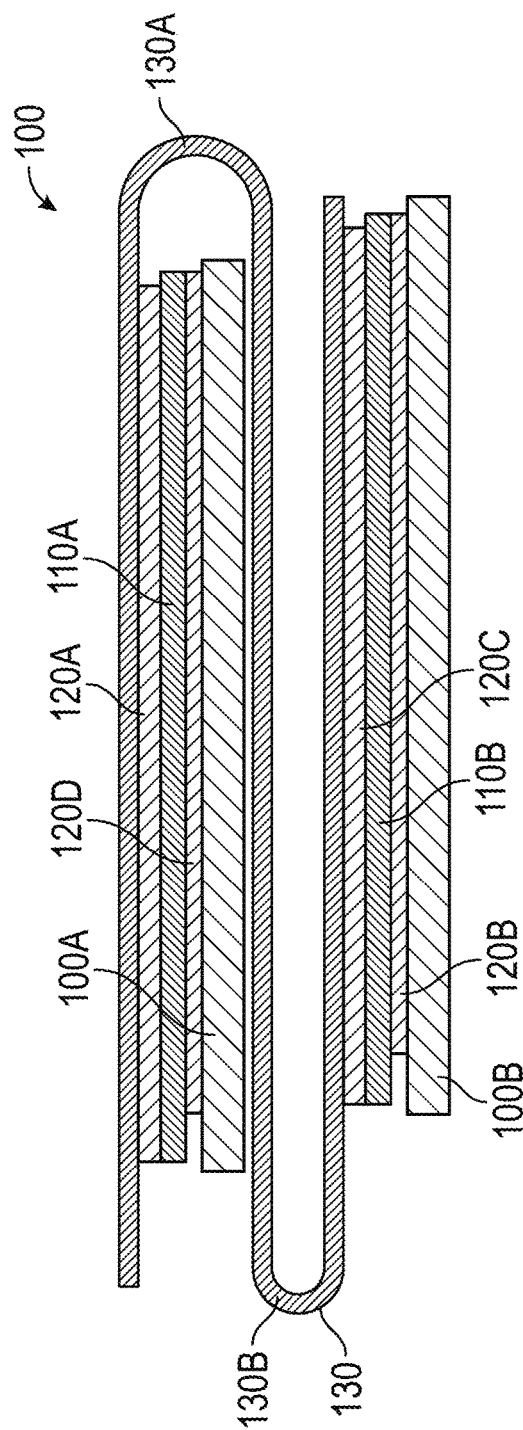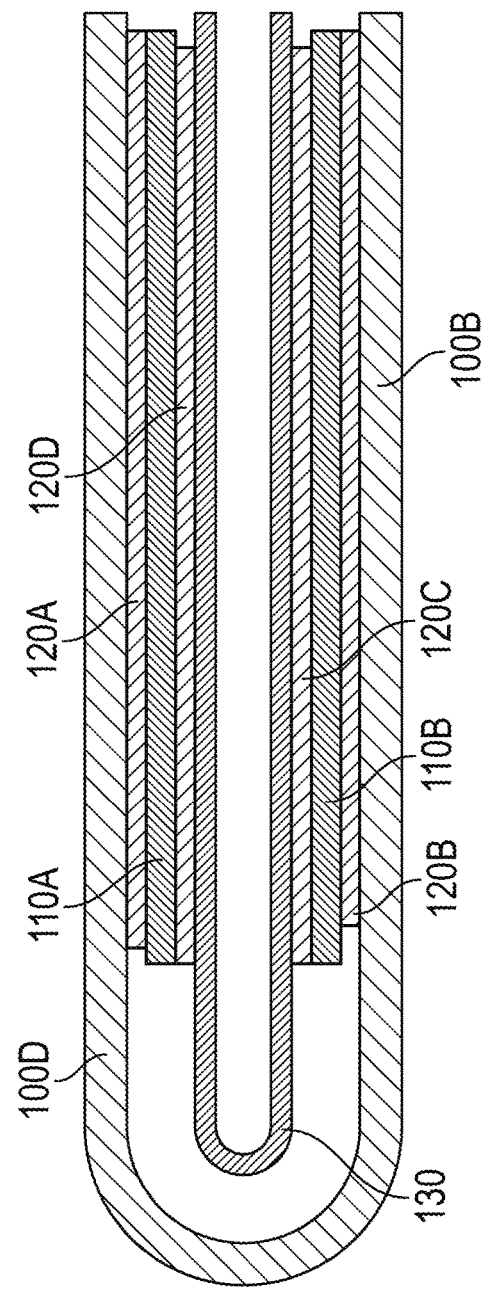
Fig. 4C
Fig. 4D

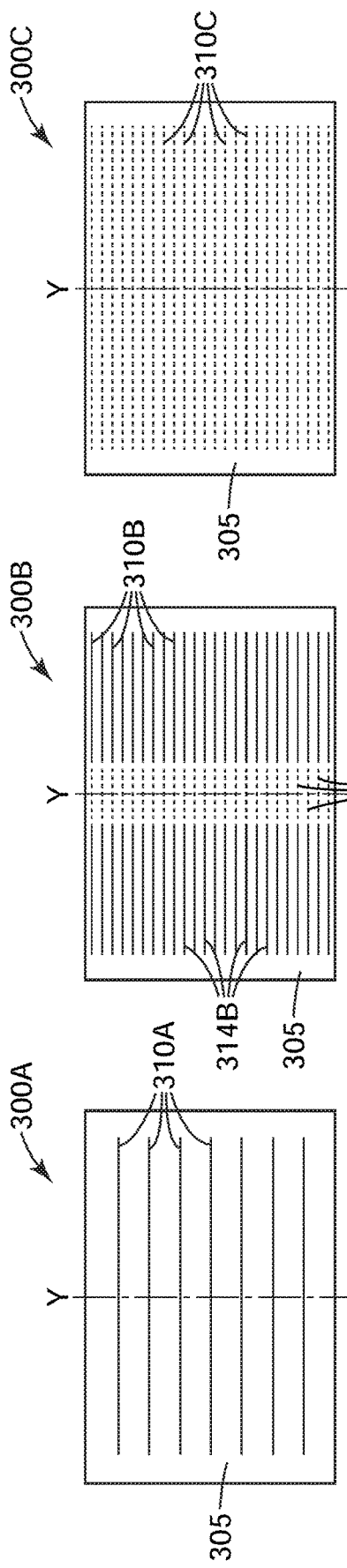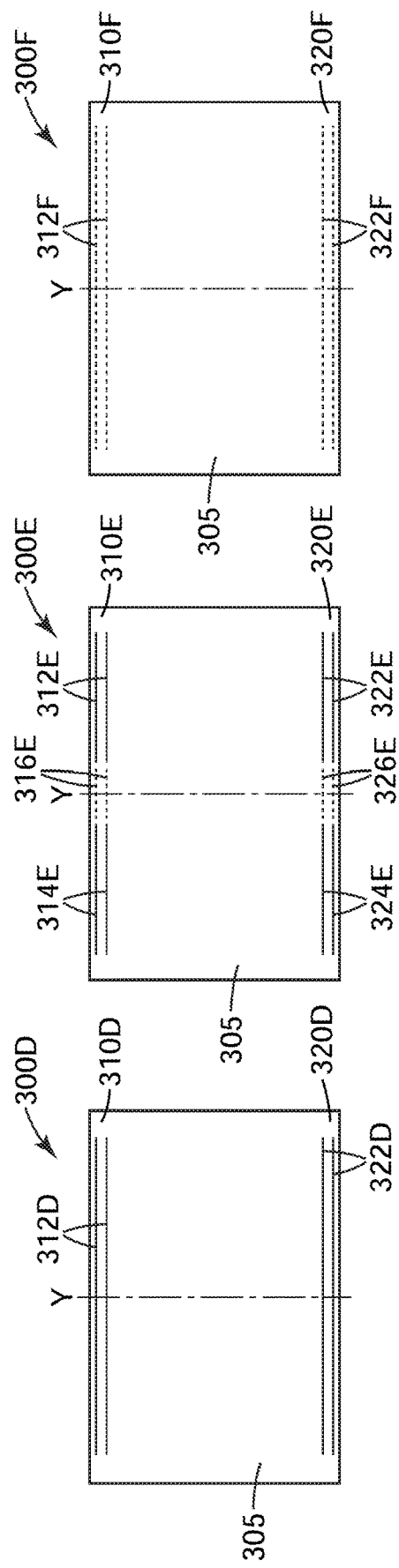

ELECTRONIC DEVICES INCORPORATING FLEXIBLE COMPONENT LAYERS WITH INTERLOCKING DEVICES

CROSS REFERENCE TO RELATED APPLICATIONS

This application is a national stage filing under 35 U.S.C. 371 of PCT/US2017/062994, filed Nov. 22, 2017, which claims the benefit of U.S. Application No. 62/428,783, filed Dec. 1, 2016, the disclosure of which is incorporated by reference in its/their entirety herein.

TECHNICAL FIELD

At least some aspects of the present disclosure relate to electronic devices incorporating flexible component layers with interlocking devices.

SUMMARY

At least some aspects of the present disclosure directs to an electronic device comprising: at least one rigid member, a flexible component layer, and an interlocking device disposed between the flexible component layer and one of the at least one rigid member. The flexible component layer has at least two sections when the flexible component layer is flexed. The interlocking device comprises a first interlocking component attached to or integrated with the flexible component layer, and a second interlocking component attached to or integrated with one of the at least one rigid member configured to engage with the first interlocking component, such that the engagement prevents the separation of the flexible component layer from the at least one rigid member along a direction generally perpendicular to a surface of the at least one rigid member.

At least some aspects of the present disclosure directs to an electronic device comprising: at least one rigid member, a flexible display, and an interlocking device disposed between the flexible display and one of the at least one rigid member. The flexible display has at least two sections when the flexible display is flexed. The interlocking device comprises a first interlocking component attached to or integrated with the flexible display, and a second interlocking component attached to or integrated with one of the at least one rigid member configured to engage with the first interlocking component, such that the engagement prevents the separation of the flexible display from the at least one rigid member along a direction generally perpendicular to a surface of the at least one rigid member.

BRIEF DESCRIPTION OF DRAWINGS

The accompanying drawings are incorporated in and constitute a part of this specification and, together with the description, explain the advantages and principles of the invention. In the drawings.

FIGS. 4A-4E illustrate examples of electronic devices incorporating flexible component layers in accordance with some embodiments of the present invention;

FIGS. 6A-6F illustrate some example of disposition of the interlocking segments;

Figure 1A:
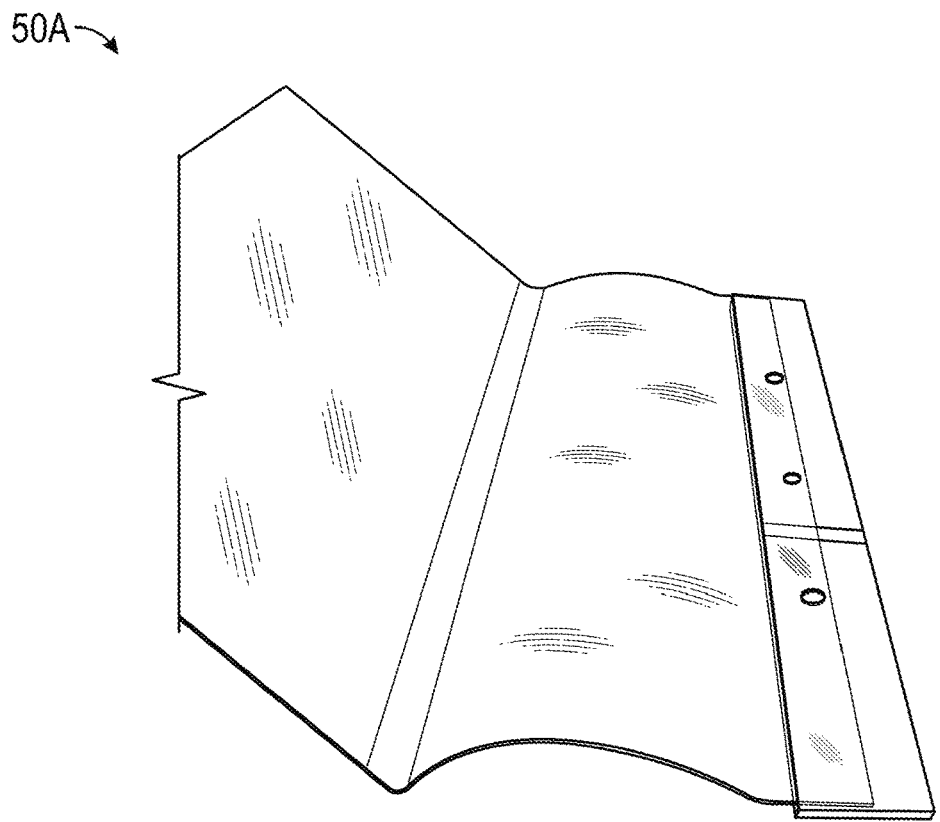
FIGS. 1A and 1B illustrate bending regions of flexible layers in two configurations.

In the drawings, like reference numerals indicate like elements. While the above-identified drawings, which may not be drawn to scale, set forth various embodiments of the present disclosure, other embodiments are also contemplated, as noted in the Detailed Description. In all cases, this disclosure describes the presently disclosed disclosure by way of representation of exemplary embodiments and not by express limitations. It should be understood that numerous other modifications and embodiments can be devised by those skilled in the art, which fall within the scope and spirit of this disclosure.

DETAILED DESCRIPTION

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

As used in this specification and the appended claims, the singular forms "a," "an," and "the" encompass embodiments having plural referents, unless the content clearly dictates otherwise. As used in this specification and the appended claims, the term "or" is generally employed in its sense including "and/or" unless the content clearly dictates otherwise.

Spatially related terms, including but not limited to, "lower," "upper," "beneath," "below," "above," and "on top," if used herein, are utilized for ease of description to describe spatial relationships of an element(s) to another. Such spatially related terms encompass different orientations of the device in use or operation in addition to the particular orientations depicted in the figures and described herein. For example, if an object depicted in the figures is turned over or flipped over, portions previously described as below or beneath other elements would then be above those other elements.

As used herein, when an element, component or layer for example is described as being "on" "connected to," "coupled to" or "in contact with" another element, component or layer, it can be directly on, directly connected to, directly coupled with, in direct contact with, or intervening elements, components or layers may be on, connected, coupled or in contact with the particular element, component or layer, for example. When an element, component or layer for example is referred to as being "directly on," "directly connected to," "directly coupled to," or "directly in contact with" another element, there are no intervening elements, components or layers for example.

In recent years, among next-generation displays, electronic devices that can be curved, bent, or folded have received increasing attention as a way to provide new user experiences. These device architectures include flexible OLEDs, plastic LCDs, fuel cells, flexible batteries, flow batteries, and the like. Typically the flexible or foldable component layer is immediately adjacent to a rigid member to provide mechanical stiffness in use. As an example, the rigid member may also be a part of the heat sink, battery, electromagnetic shielding, or other components for a display panel.

Figure 1B:
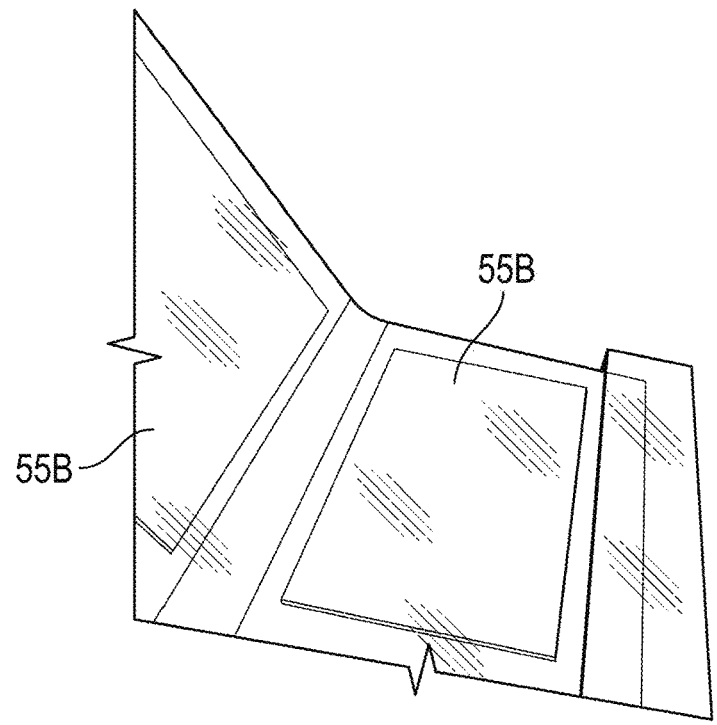

Usually the boundary condition between such a flexible component layer and such a rigid member can affect both the aesthetics of the device as well as its fatigue performance over thousands of cycles since fatigue life is generally inversely proportional to the maximum strain in a given folding or bending cycle. Fatigue occurs when an object is subjected to repeated loading and unloading (e.g., folding and unfolding) and fatigue life is often a function of the magnitude of the fluctuating stress, object physical properties, geometry of the object and test conditions. FIG. 1A illustrates a flexible display forming a buckle where one side of the film is not secured to the support plate near the pivot axis. As can be seen from FIG. 1A, the flexible display 50A develops a large bow in the middle as the display bends when one end is fixed. In contrast, in FIG. 1B, the flexible display 50B is attached to rigid elements 55B on two sections of the display respectively. The bending region is smooth and no buckling. However, the increased strain on the flexible display in this configuration can lead to shortened fatigue life for elements of the display, such as protection layer, touch sensor, active matrix drive electronics, barrier layers, and the like. Thus, there is a need for providing a means for attaching a flexible display to a rigid member, such that the flexible display has a smooth interface when it is opened, bended, folded, or closed and it does not have shortened life to fatigue elements of the display. At least some aspects of the present disclosure are directed to an electronic device having a flexible component layer attached to a rigid element by an attachment device, such that the fatigue life for elements in the component layer do not have shortened life. In some embodiments, the attachment device includes one or more interlocking devices.

Figure 2:
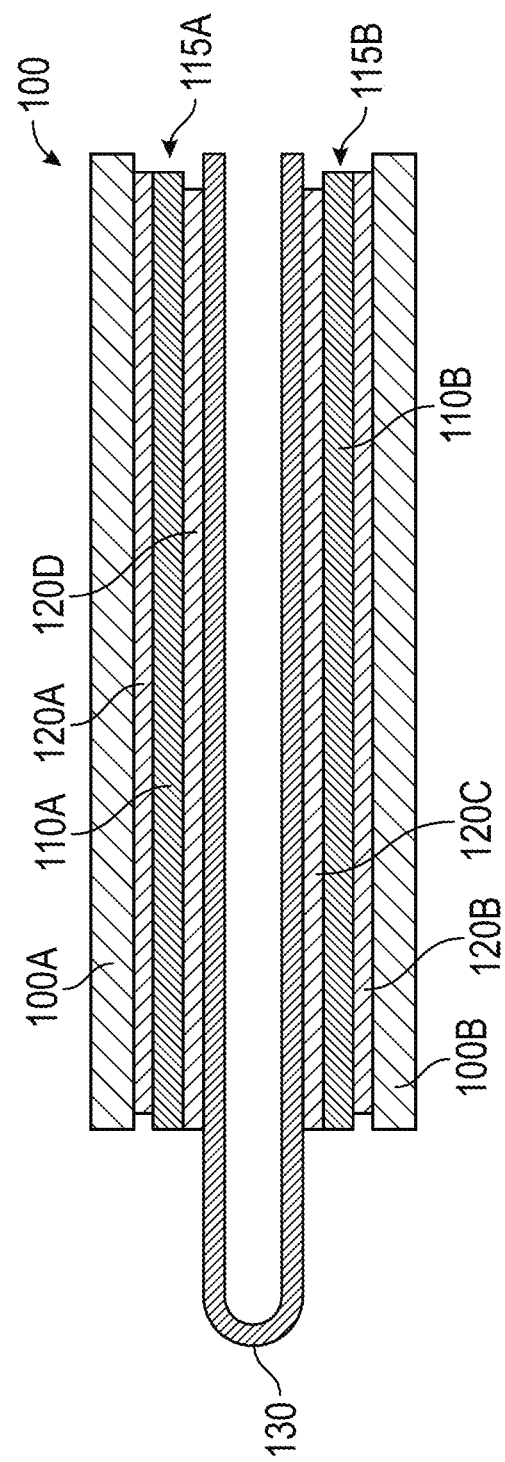
FIG. 2 illustrates an example embodiment of an electronic device incorporating a flexible component layer in a folding configuration.

FIG. 2 illustrates an example embodiment of an electronic device 100 incorporating a flexible component layer 130 in a folding configuration. In the embodiment illustrated in FIG. 2, the electronic device 100 includes a flexible component layer 130, two rigid members (or rigid supports) 100A and 100B, two bonding layers 115A and 115B for attaching the flexible component layer 130 to the rigid members 100A and 100B respectively. In some cases, the flexible component layer 130 is a flexible display, or referred to as a flexible display panel. In some embodiments, the bonding layer 115A includes an interlocking device 110A and adhesive layers 120A and 120D. In some embodiments, the bonding layer 115B includes an interlocking device 110B and adhesive layers 120B and 120C. The interlocking devices 110A and 110B are described in more details below. The adhesives layers 120A, 120B, 120C, and 120D may include same or different adhesives, for example, 300LSE Acrylic Adhesive (available from 3M Company, St. Paul, Minn.), Adhesive Transfer Tape 9472LE (available from 3M Company, St. Paul, Minn.), Double Coated Tape 476XL synthetic rubber adhesive (available from 3M Company, St. Paul, Minn.), or the like. In some cases, the flexible component layer 130 includes a heat spreader layer.

Figure 3:
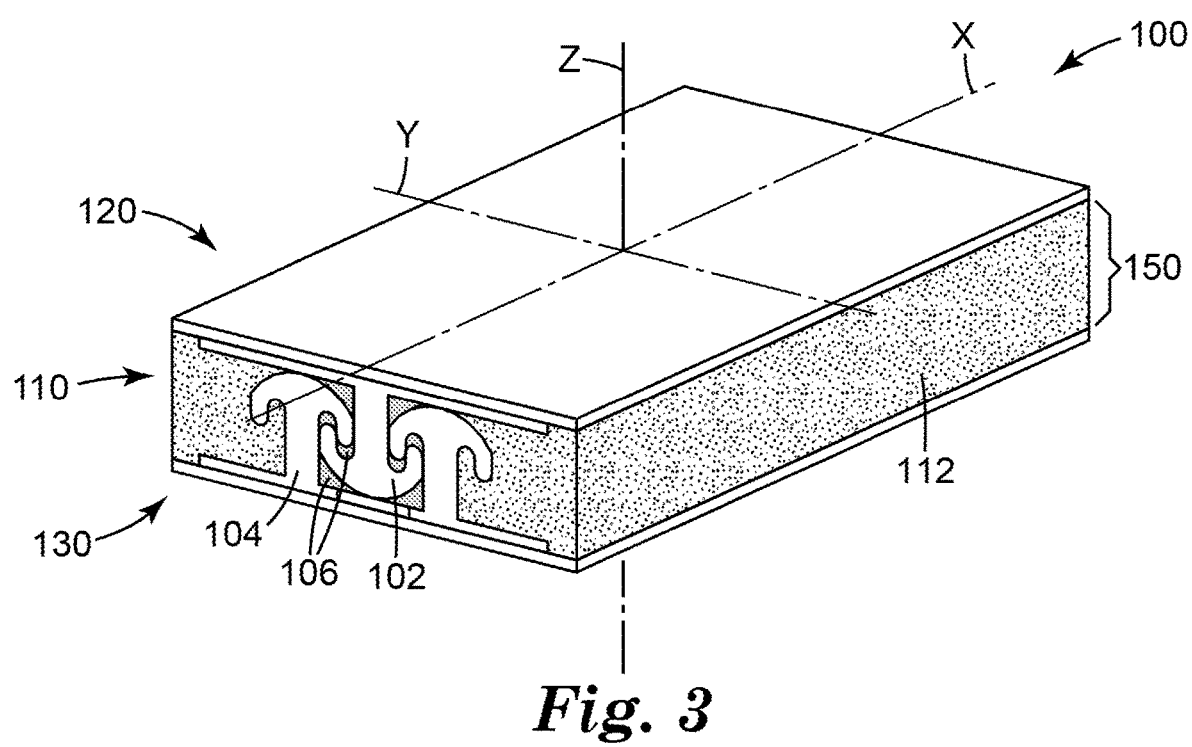
FIG. 3 illustrates a close-up conceptual view of a portion of an electronic device using an interlocking device.

FIG. 3 illustrates a close-up conceptual view of a portion of an electronic device 100 using an interlocking device 110. The electronic device 100, as illustrated, includes a first layer 120 (for example, a layer of a flexible component layer) and a second layer 130 (for example, a layer of a rigid element) and a bonding layer 150 disposed between the two layers (120, 130). The bonding layer 150 includes the interlocking device 110. The interlocking device 110 includes a first interlocking component 102 attached to or integrated with the first layer 120 and a second interlocking component 104 attached to or integrated with the second layer 130. The second interlocking component 104 is configured to engage with the first interlocking component 102. In some embodiments, the engagement prevents the separation of the first layer 120 from the second layer 130 along the direction Z perpendicular to the surface of the second layer. In some embodiments, the engagement between the first and second interlocking components provides little or no restriction of the first layer 120 sliding with respect to the second layer in the direction X along the surface of the second layer 130. In some cases, the first interlocking component 120 and/or the second interlocking component 130 have channels that can facilitate or guide sliding between the two components. For example, the first interlocking component 120 and/or the second interlocking component 130 have rails or generally aligned elements forming channels.

In some implementations, the bonding layer 150 can include bonding materials 112 can be disposed proximate to the first layer 120 and the second layer 130 together with the interlocking device 110. In some cases, the bonding material 112 can include an optically clear material, for example, optically clear adhesive, optically clear gel, optically clear liquid, or the like. With the interlocking device, the bonding material 112 can use materials that have relative low viscosity, for example, a low viscosity liquid, to reduce resistance to bending. In some embodiments, the bonding material 112 can use a material that has a refractive index closely matching the refractive index of the interlocking device 110. In some cases, the bonding material 112 can have an overall refractive index that has an absolute difference less than or equal to 0.05 from the refractive index of the part of interlocking device 110, more particularly the interlocking components 102 and 104, within the viewing area. For example, the bonding material 112 can include materials, for example, acrylates, urethanes, silicones, polyolefins, or the like. In some cases, the bonding material 112 could include thermal conductive particles to enhance heat dissipation, for example, $Al_2O_3$, metal or carbon particles. In some cases, the bonding material 112 could include dielectric or ferromagnetic particles to reduce electro-magnetic interference, for example, $BaTiO_3$ or $Fe_3O_4$ particles.

In some embodiments, the interlocking device 110 can use materials that are optically clear, for example, material with visible light transmission at least 90% and haze less than 2%. In some cases, the interlocking device 110 can use materials that are not optically clear. In some implementations, the interlocking device 110 can include air gap between interlocking components. In some cases, the interlocking device 110 may use an optically clear material, for example, optically clear polymer, or the like. In some embodiments, the optically clear polymer may be a selected polymer with a refractive index between 1.50 and 1.60, for example, polyester, polymethylmethacrylate, polycarbonate, cyclic olefin copolymer, or the like.

In some embodiments, the interlocking device 110 has a height no more than 10 mm. In some cases, the interlocking device 110 has a height no more than 1 mm. In some cases, the interlocking device 110 has a height no more than 200 micrometers. In some cases, the interlocking device 110 has a height no more than 100 micrometers. In some cases, the interlocking device 110 has a height no more than 10 micrometers. In some cases, the interlocking device 110 has a height no less than 5 micrometers. In some embodiments, the interlocking device 110 further comprises a coupling material 106 disposed proximate to the first interlocking component 102 and the second interlocking component 104. In some cases, the coupling material 106 includes materials that have relatively low elastic modulus, low creep, and a high degree of shear strain under shear load to facilitate the repeated bending, for example, liquid, adhesive, gel, or the like. As an example, the coupling material 106 can include a low viscosity liquid to reduce frictional drag between interlocking components and reduce resistance to bending.

In some embodiments, the coupling material 106 can use materials that have relative low viscosity, for example, a low viscosity liquid, to reduce resistance to bending. In other embodiments the coupling material 106 can use materials where the viscosity increases with strain rate providing a means of dampening or strain rate control. These are known as shear rate thickening or dilatant fluids. Dilatancy is a property that exists primarily in colloidal dispersions. A colloidal dispersion is where one substance is microscopically dispersed evenly throughout another. In some embodiments, the coupling material 106 could aid with heat transfer from the flexible component layer to the rigid members, which is also likely the primary heat sink. In some cases, the coupling material 106 could include thermal conductive particles to enhance heat dissipation, for example, $Al_2O_3$, metal or carbon particles. The coupling material may include materials such as, for example, water, deionized water, glycol/water solutions, thermal grease such as 3M TCG-2035, and dielectric fluids such as fluorocarbons and polyalphaolefin. In some embodiments, the thermal conductivity of the coupling material may range from 0.02 to 0.6 W/m·K. In some embodiments, the thermal conductivity of the coupling material may range from 0.02 to 3.0 W/m·K. In some embodiments, the thermal conductivity of the coupling material may range from 0.02 to 4.1 W/m·K. In some cases, the viscosity of the coupling material may range from 5,000 cP to 100,000 cP. In some cases, the viscosity of the coupling material may range from 0.89 cP to 542,000 cP. In some cases, the viscosity of the coupling material may range from 0.89 cP to 2,000,000 cP. In some cases, the coupling material 106 could include dielectric or ferromagnetic particles to reduce electro-magnetic interference, for example, $BaTiO_3$ or $Fe_3O_4$ particles. In some cases, the coupling material 106 can use same materials as the bonding material 112.

In some embodiments, the coupling material 106 can use a material that has a refractive index closely matching the refractive index of the interlocking device 110, more particular the interlocking components 102 and 104. In such cases, the optical clarity of the interlocking device 110 can be restored by eliminating the air gaps between the interlocking components 102 and 104. In some cases, the coupling material 106 can have an overall refractive index that has an absolute difference less than or equal to 0.05 from the refractive index of the part of interlocking device 110, more particularly the interlocking components 102 and 104. For example, the coupling material 106 can include materials such as, for example liquids containing phenyl and phosphorus groups such as Santicizer 141 (available from Ferro Global at Mayfield Heights, Ohio, USA), or gels formulated using such liquids in combination with acrylate polymers using monomers containing higher refractive index contributing functional groups such as aromatic groups like phenyl, naphtyl, anthracyl, sulfur groups, bromine groups, or the like, to control and adjust the optical index of the gel. If a closely matching adhesive is used as coupling material 106 it cannot restrict the relative movement (i.e. relative sliding) of the interlocking device 110.

In some embodiments, the first interlocking component 102 or the second interlocking component 104 comprises a plurality of engagement elements. At least some of the engagement elements have a cross-sectional shape having a stem and a cap wider than the stem, as illustrated in FIG. 1, such that the engagement between the engagement elements prevents separation or displacement along the Z axis. In some cases, the first or the second interlocking component includes a plurality of engagement rails allowing sliding along the X axis. In some implementations, at least some of the engagement rails have a cross-sectional shape having a post and a cap. In some embodiments, each of the plurality of engagement elements or engagement rails has a height no more than 10 mm. In some cases, each of the plurality of engagement elements or engagement rails has a height no more than 1 mm. In some cases, each of the plurality of engagement elements or engagement rails has a height no more than 200 micrometers. In some cases, each of the plurality of engagement elements or engagement rails has a height no more than 100 micrometers. In some cases, the interlocking device 110 has a height no more than 10 micrometers. In some cases, each of the plurality of engagement elements or engagement rails has a height no less than 5 micrometers.

In some cases, the first interlocking component 102 includes a set of first engagement elements and the second interlocking component 104 includes a set of second engagement elements. In some cases, the first engagement elements have generally same shapes as the second engagement elements.

In some cases, the electronic device 100 has an X axis and a Y axis generally perpendicular to the X axis, where the electronic device 100 is configured to bend about the Y axis. In some embodiments, the interlocking device 110 is disposed along the X axis. In some cases, the interlocking device 110 is disposed proximate to two opposing edges of the flexible display 100 along the X axis. In some configurations, the electronic device 100 may include more than two functional layers, where every two adjacent functional layers have a bonding layer in between and the bonding layer includes an interlocking device.

Figure 4A:
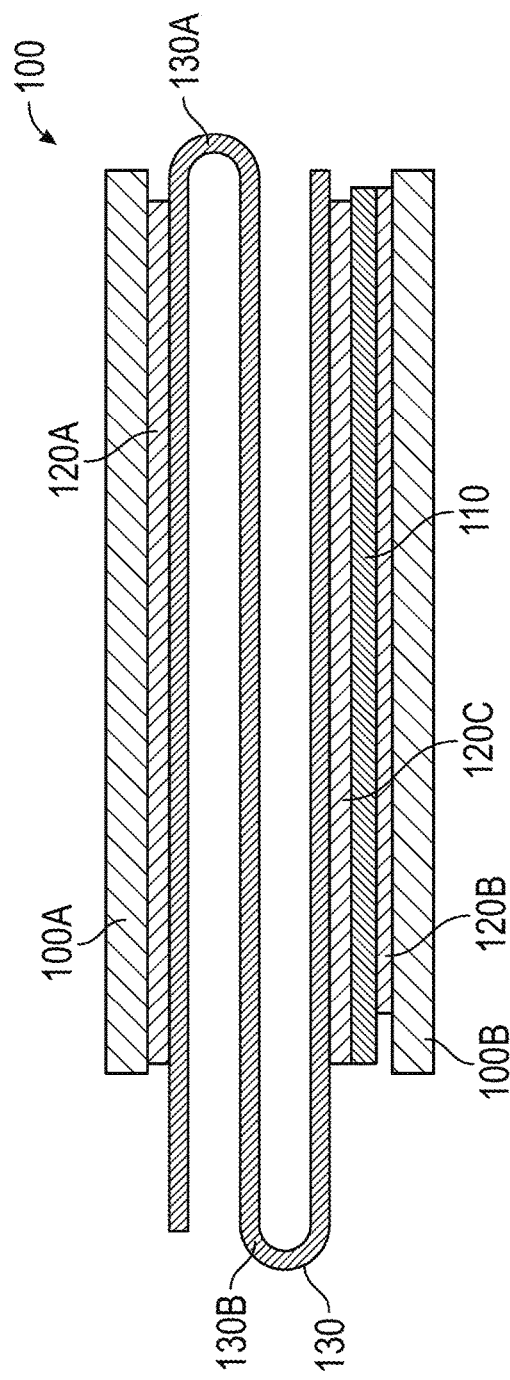
Figure 4B:
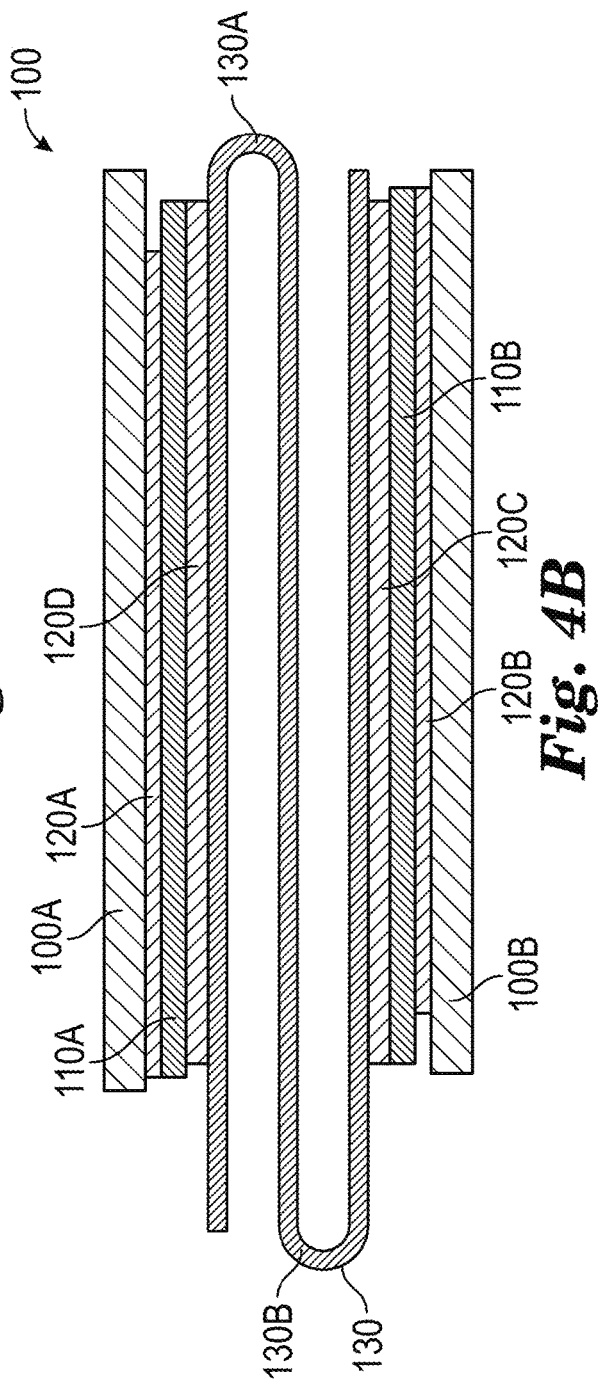

FIGS. 4A-4E illustrate example embodiments of electronic devices. Components in FIGS. 4A-4E have same or similar embodiments or configurations as components with same numbers in FIG. 3 as described herein. FIGS. 4A-4C illustrate the flexible component layer 130 that have two bent regions (130A, 130B) forming an S-shape when the electronic device is closed. One or more interlocking devices 110 (or 110A, 110B) may be present. As shown in FIG. 4A, only one interlocking device 110 is used in the electronic device 100, and the two bent regions of the flexible component layer 130 forming an S-shape inside the two rigid members 100A and 100B. In the embodiment illustrated in FIG. 4B is substantially the same as that of FIG. 4A, while two interlocking devices 110A and 110B are used. FIG. 4C illustrates another embodiment of the electronic device 100, in which the S-shaped flexible component layer 130, as defined by its two bent regions, has two sections are sandwiched in the rigid members 100A and 100B, and one section disposed outside the boundaries and curved around the rigid member 100A.

Figure 4E:
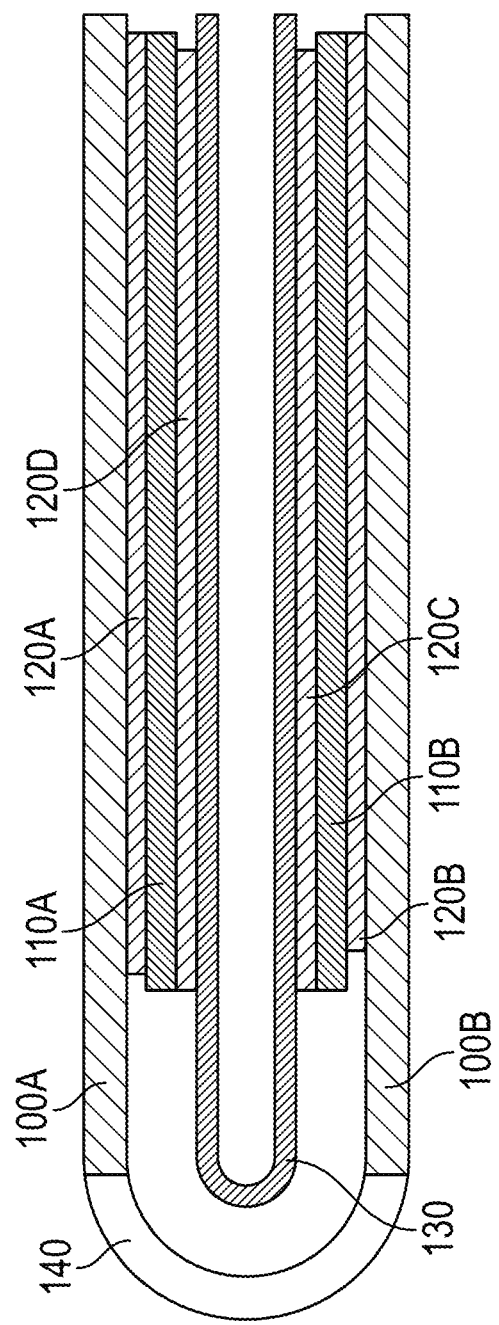

In some embodiments, the rigid members 100A and 100B are separate components, and are coupled together via an external hinge (not shown) to allow the electronic device to open and close (flex). In some other embodiment, the electronic device 100 includes one rigid member. For example, as shown in FIG. 4D, the rigid member 100D constitute a continuous rigid support. In such embodiments, the rigid support can be bendable, but is still much stiffer than the flexible component layer 130. FIG. 4E illustrates another example of the electronic device, where the rigid support to which the flexible component layer 130 is attached includes the two rigid members 100A and 100B and a flexible section 140 interconnecting with the two rigid members 100A and 100B.

In some embodiments, some part or the whole interlocking component could be co-extruded, or produced through other means, directly on the functional layers of the electronic device. For example, the backside of the display layer (for example the polyimide substrate or copper heat sink layers) could have mechanical features that interlock with the mechanical features of a rigid device component, enabling shear free sliding of the two material layers. These embodiments would reduce the requirements of the additional adhesive layer and instead, be created directly on the functional layers. These structures could be produced on one or both side of any functional layer of the electronic device.

Figure 5A:
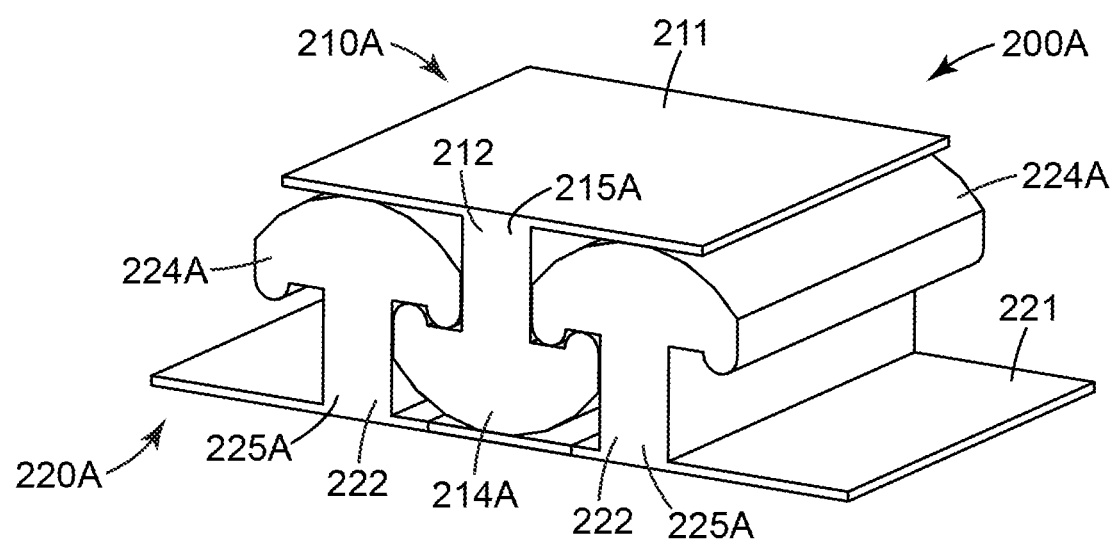
FIGS. 5A-5K illustrate some examples of interlocking devices.

FIGS. 5A-5K illustrate some examples of interlocking devices. Referring to FIG. 5A, an interlocking device 200A includes a first interlocking component 210A and a second interlocking component 220A configured to engage with the first interlocking component 210A. The first interlocking component 210A can include a substrate 211 and one or more engagement rails 215A. The second interlocking component 220A can include a substrate 221 and one or more engagement rails 225A. The engagement rail 215A includes a stem 212 and a cap 214A that is wider than the stem 212. The cross section of the engagement rail 215A is in a mushroom-like shape. Similarly, the engagement rail 225A includes a stem 222 and a cap 224A that is wider than the stem 222. This design may have a little gap between the two interlocking components.

Figure 5B:
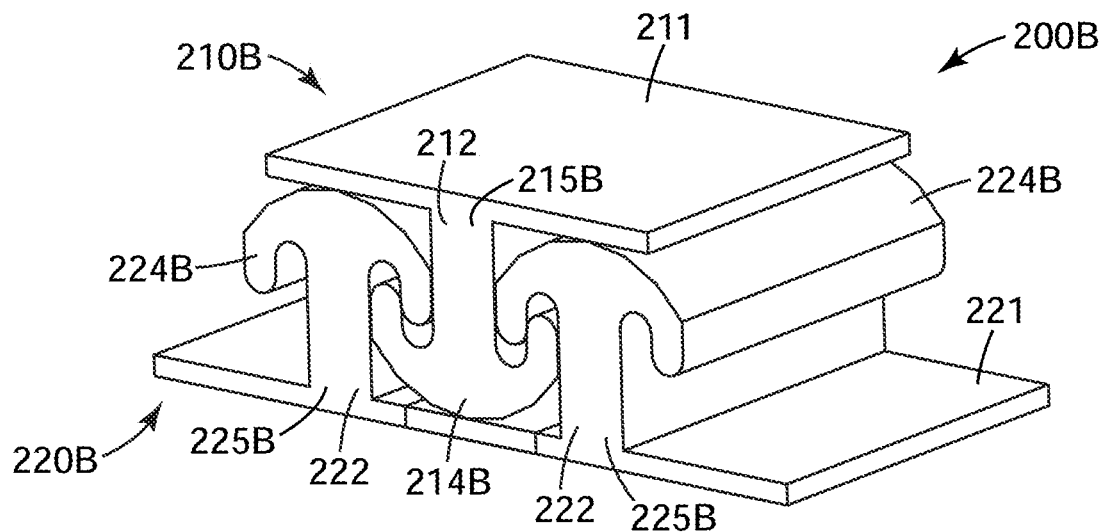

FIG. 5B illustrates a similar design of an interlocking device 200B as the interlocking device 200A illustrated in FIG. 5A. The first interlocking component 210B can include a substrate 211 and one or more engagement rails 215B. The second interlocking component 220B can include a substrate 221 and one or more engagement rails 225B. The engagement rail 215B includes a stem 212 and a cap 214B that is wider than the stem 212. The cross section of the engagement rail 215B is in a mushroom-like shape. Similarly, the engagement rail 225B includes a stem 222 and a cap 224B that is wider than the stem 222. With this configuration, the two interlocking components (210B, 220B) have more overlaps between the caps (214B, 224B) that may provide higher through thickness bonding strength than the configuration illustrated in FIG. 5A.

Figure 5C:
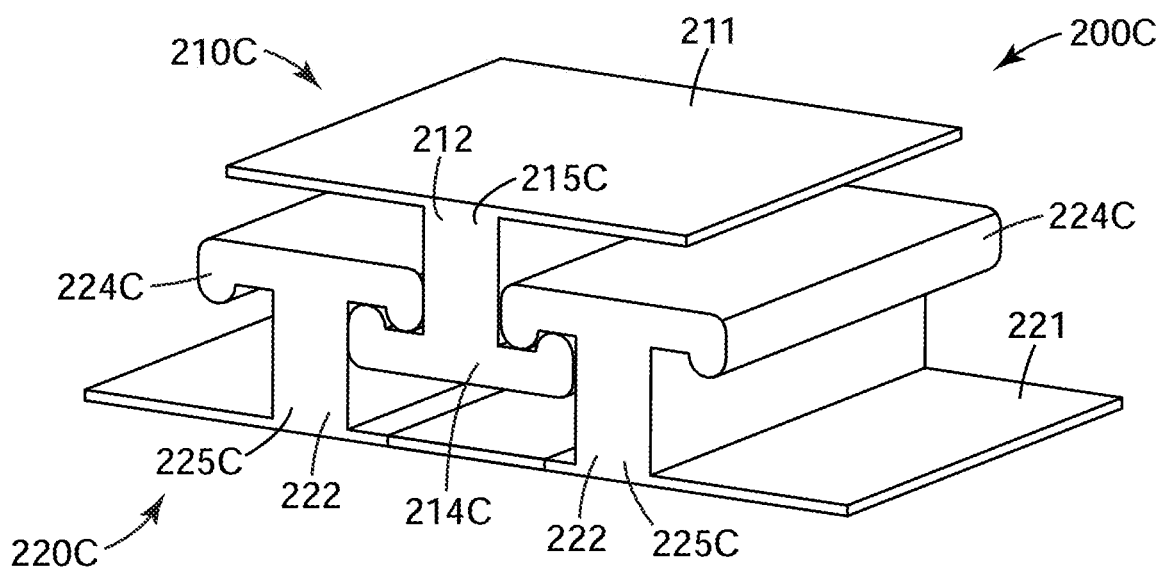

FIG. 5C illustrates an example of an interlocking device 200C. The interlocking device 200C includes a first interlocking component 210C and a second interlocking component 220C configured to engage with the first interlocking component 210C. The first interlocking component 210C can include a substrate 211 and one or more engagement rails 215C. The second interlocking component 220C can include a substrate 221 and one or more engagement rails 225C. The engagement rail 215C includes a stem 212 and a cap 214C that is wider than the stem 212. The cross section of the engagement rail 215C is in a mushroom-like shape. Similarly, the engagement rail 225C includes a stem 222 and a cap 224C that is wider than the stem 222. The caps 214C and 224C are generally flat. With this design, the two interlocking components (210C, 220C) having more gaps in between, which may reduce friction and improve bending flexibility. More configurations and relative spacing and materials of engagement rails are described in U.S. Pat. Nos. 6,357,128, 6,546,604, and 6,588,074, which are incorporated by reference in their entirety.

Figure 5D:
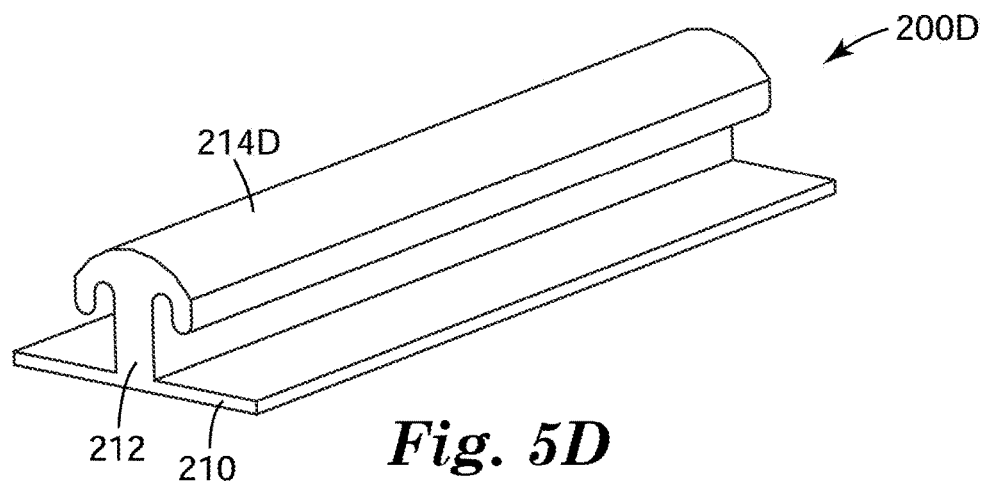
Figure 5E:
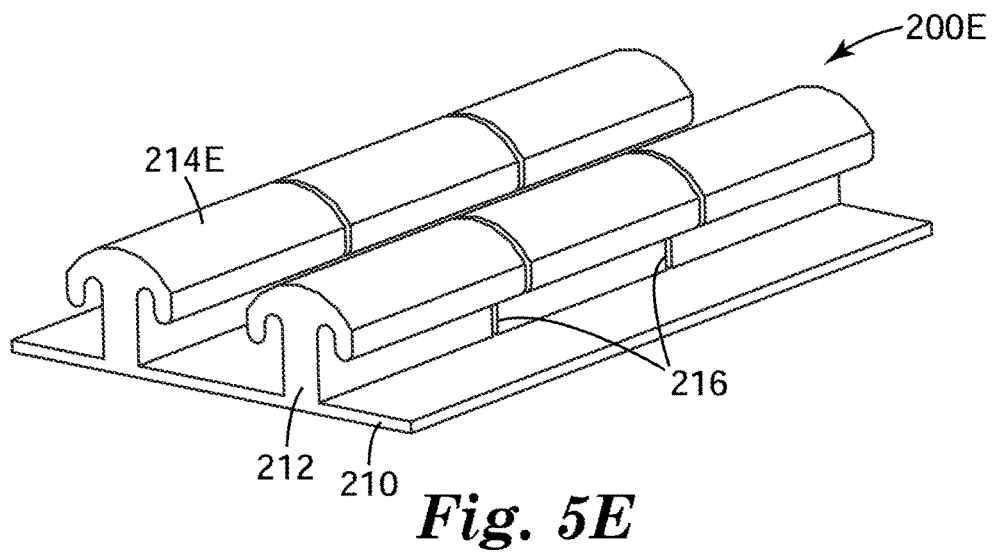

FIGS. 5D and 5E illustrate some examples of engagement rails (200D, 200E) with similar shapes. The engagement rail 200D, supported by a substrate 210, has a stem 212 and a cap 214D, similar to the ones illustrated in FIG. 5B. The engagement rail 200E has a similar shape as the engagement rail 200D but one or more slits 216 along a direction generally perpendicular to the longitudinal direction of the engagement rail 200E. In some cases, the slit 216 may have a small angle, for example, 5°, from the direction perpendicular to the general surface of the engagement rail 200E. In some embodiments, the distance between two adjacent slits 216 is within a range between ¼ of a height of the engagement rail 200E and 50 times of the height. In some cases, the slits 216 can be an opening through a portion of the engagement rail 200E, for example, the entirety of the cap 214E, stem 212, and/or substrate 210. As another example, the slits 216 can be an opening through a portion of the cap 214D, stem 212, and/or substrate 210. In some cases, the slits 216 can have a predefined width, which may allow bending along both directions (i.e., inward and outward) that are generally perpendicular to the surface of the substrate 210. The slits 216 can be disposed along the entire length of the engagement rail, or proximate to selected location(s). The slit 216 can improve bending flexibility of the engagement rails and the interlocking device formed thereof.

Figure 5F:
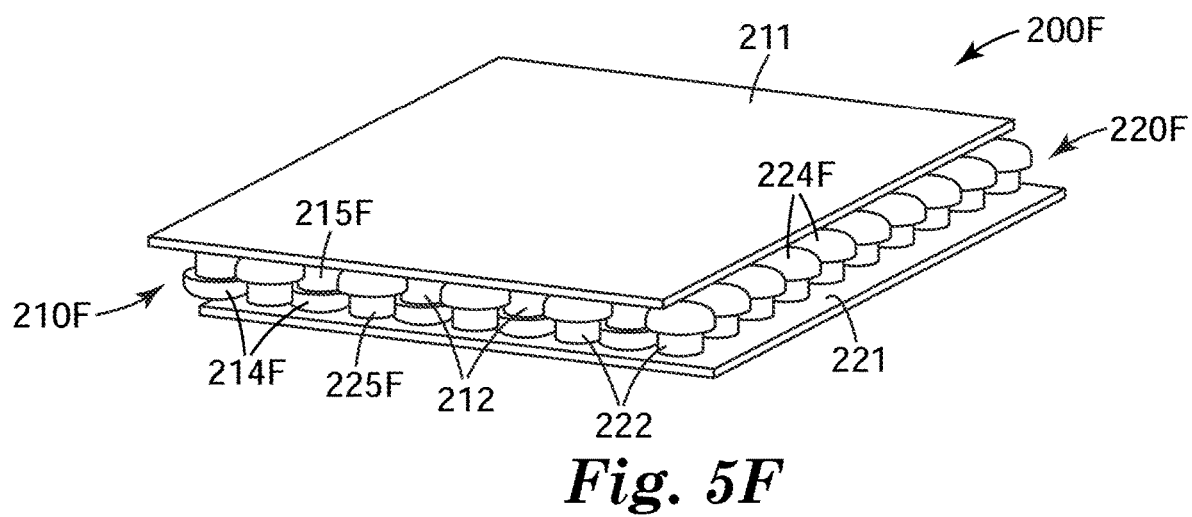

FIG. 5F illustrates another example of an interlocking device 200F. The interlocking device 200F includes a first interlocking component 210F and a second interlocking component 220F configured to engage with the first interlocking component 210F. The first interlocking component 210F can include a substrate 211 and one or more engagement elements 215F. The second interlocking component 220F can include a substrate 221 and one or more engagement elements 225F. The engagement element 215F includes a stem 212 and a cap 214F that is wider than the stem 212. The cross section of the engagement element 215F is in a mushroom-like shape. Similarly, the engagement element 225F includes a stem 222 and a cap 224F that is wider than the stem 222. In some embodiments as illustrated in FIG. 5F, the engagement elements 215F and 225F are disposed with regular spacing. In some cases, the engagement elements 215F and/or 225F form rows to allow or guide sliding. The spacing of the rows of stems and the size of the caps can be selected to provide a desired degree of mechanical engagement along the direction generally perpendicular to the substrate (211 or 221), while still allowing easy sliding along the direction of the rows. The caps, on the stems of the interlocking components, on one or both of the interlocking components, can have a shape other than generally round or mushroom shaped. For example the caps on one or more engagement elements can be oblong or oval shaped. Suitable materials and configurations for this include those taught in U.S. Pat. Nos. 5,077,870 and 5,845,375 for round or mushroom shaped caps, as taught in U.S. Pat. No. 5,868,987 for oval or oblong shaped caps, and other configurations taught in U.S. Pat. No. 6,367,128, which are incorporated by reference in their entireties.

Figure 5G:
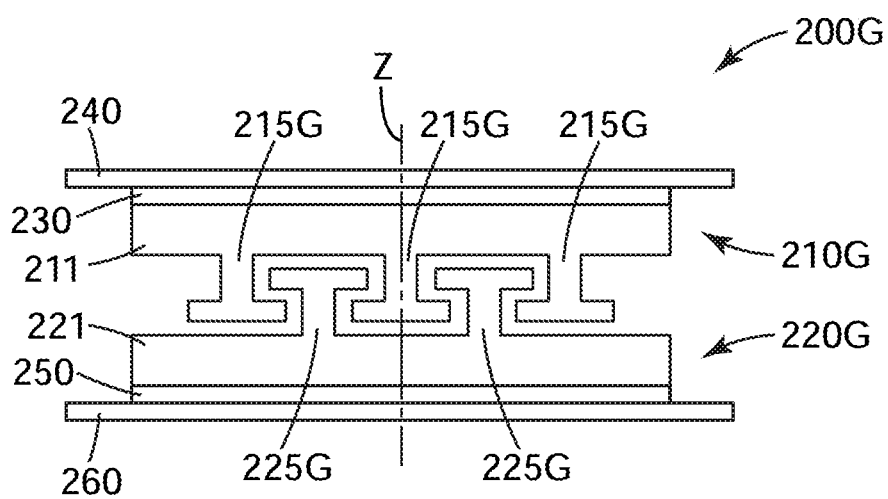
Figure 5H:
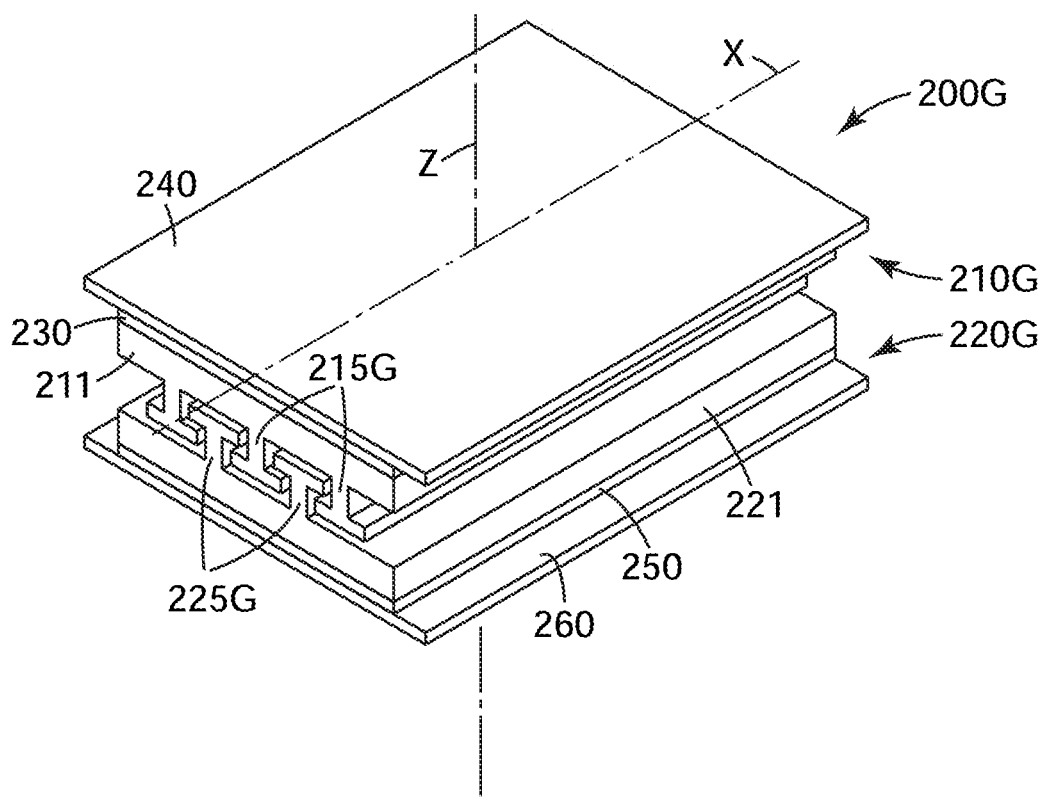

FIG. 5G illustrates a cross-section view of a conceptual example of interlocking device 200G that can be provided in a tape form or a sheet form; and FIG. 5H illustrates a prospective view of the interlocking device 200G. The interlocking device 200G includes a first interlocking component 210G, a second interlocking component 220G, a first adhesive layer 230, a first release liner 240, a second adhesive layer 250, and a second release liner 260. The first interlocking component 210G includes a substrate 211 and one or more engagement rails 215G and the second interlocking component 220G includes a substrate 221 and one or more engagement rails 225G. The engagement rails (215G, 225G) allow relative sliding along longitudinal direction of the rail between the interlocking components and prevent separation along Z direction that is generally perpendicular to the surface of the substrate 211 or 221. The interlocking components (210G, 220G) may use any configuration of interlocking components described herein, for example, including slits.

Figure 5I:
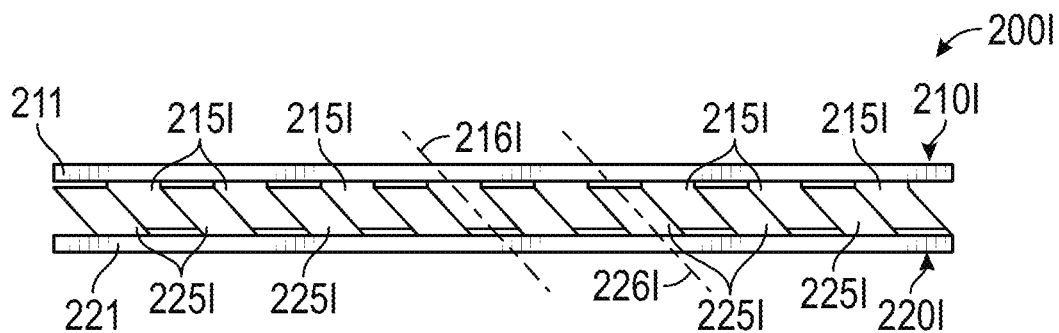

FIG. 5I illustrates a cross-section view of a conceptual example of interlocking device 200I. The interlocking device 200I includes a first interlocking component 210I and a second interlocking component 220I configured to engage with the first interlocking component 210I.

The first interlocking component 210I can include a substrate 211 and one or more engagement rails 215I extending from the substrate 211 along an out of plane axis 216I. The second interlocking component 220I can include a substrate 221 and one or more engagement rails 225I extending from the substrate 221 along an out of plane axis 226I. The axes of the engagement rails of 215I are parallel to the axes of the engagement rails of 225I to allow sliding of rails 215I relative to 225I. In some embodiments, the out of plane axis 216I is generally parallel to the out of plane axis 226I. In some implementations, the axis 216I is slanted from the surface of the substrate 211. In some implementations, the axis 226I is slanted from the surface of the substrate 221.

Figure 5J:
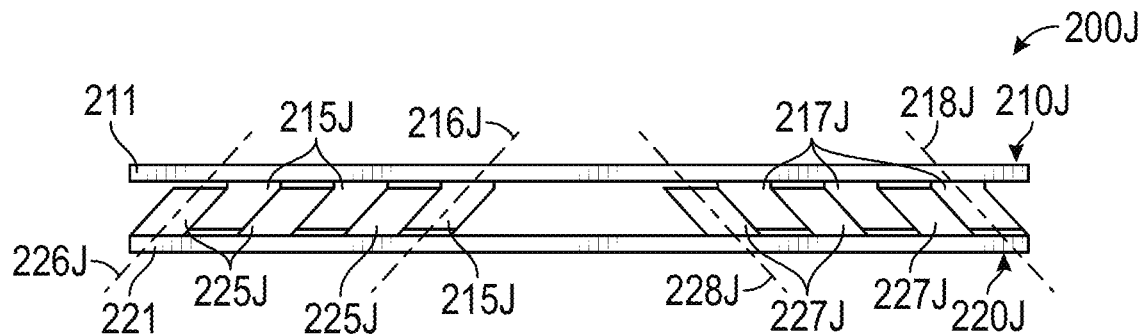

FIG. 5J illustrates a cross-section view of a conceptual example of interlocking device 200J. The interlocking device 200J includes a first interlocking component 210J and a second interlocking component 220J configured to engage with the first interlocking component 210J. The first interlocking component 210J can include a substrate 211, a first set of engagement rails 215J extending from the substrate 211 along an out of plane axis 216J, and a second set of engagement rails 217J extending from the substrate 211 along an axis 218J. The second interlocking component 220J can include a substrate 221, a first set of engagement rails 225J extending from the substrate 221 along an axis 226J, and a second set of engagement rails 227J extending from the substrate 221 along an axis 228J. The axes of the engagement rails of 215J are parallel to the axes of the engagement rails of 225J. The axes of the engagement rails of 217J are parallel to the axes of the engagement rails of 228J. Further the axes of the engagement rails of 215J and 225J are parallel to the axes of the engagement rails of 227J and 228J to allow sliding of rails 215J and 217J relative to 225J and 228J. In some embodiments, the out of plane axis 216J is generally parallel to the out of plane axis 226J. In some embodiments, the out of plane axis 218J is generally parallel to the out of plane axis 228J. In the embodiment illustrated, the out of plane axis 216J is not parallel to the out of plane axis 218J, and the out of plane axis 226J is not parallel to the out of plane axis 228J. In some implementations, the out of plane axis 216J is slanted from the surface of the substrate 211. In some cases, the out of plane axis 218J is slanted from the surface of the substrate 211. In some implementations, the out of plane axis 226J is slanted from the surface of the substrate 221. In some cases, the out of plane axis 228J is slanted from the surface of the substrate 221.

Figure 5K:
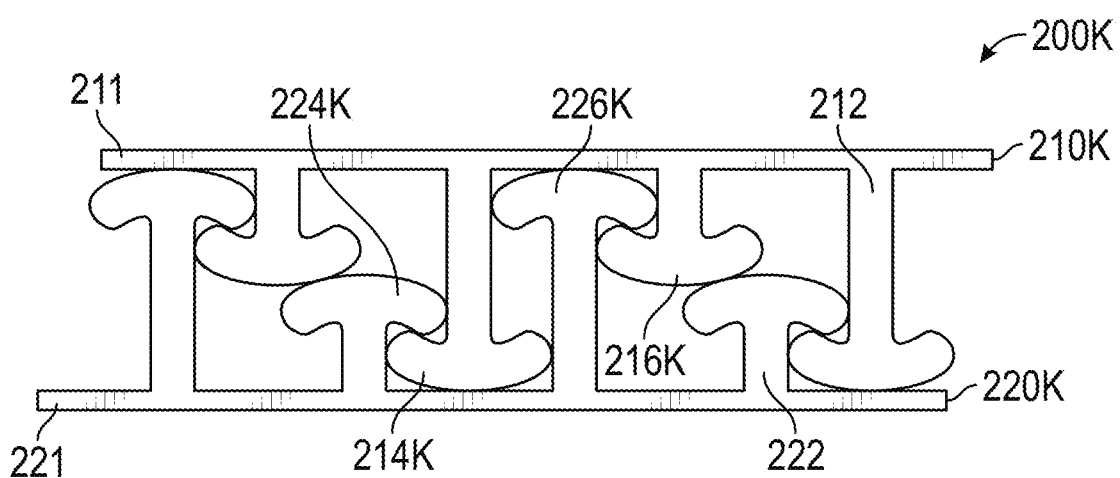

FIG. 5K illustrates an example of an interlocking device 200K. The interlocking device 200K includes a first interlocking component 210K and a second interlocking component 220K configured to engage with the first interlocking component 210K. The first interlocking component 210K can include a substrate 211, one or more longer engagement rails 214K, and one or more shorter engagement rails 216K. The second interlocking component 220K can include a substrate 221, one or more shorter engagement rails 224K, and one or more longer engagement rails 226K. In the embodiment illustrated, the engagement rails 214K are configured to engage with the engagement rails 224K and the engagement rails 216K are configured to engage with the engagement rails 226K. Each of the engagement rails 214K and 216K includes a stem 212 and a cap that is wider than the stem 212. Similarly, each of the engagement rails 224K and 226K includes a stem 222 and a cap that is wider than the stem 222. With this design, the two interlocking components (210K, 220K) having more gaps in between, which may reduce friction and improve bending flexibility.

In some embodiments, an interlocking device may include a plurality of interlocking segments. Each of the interlocking segments can include two interlocking components, where each interlocking component may use any configuration of interlocking components described herein. The plurality of interlocking segments may be disposed in a geometry pattern. FIGS. 6A-6F illustrate some example of disposition of the interlocking segments. FIG. 6A illustrates an interlocking device 300A disposed on a functional layer 305 (e.g., rigid member, display layer, etc.) of an electronic device. The interlocking device 300A includes a plurality of interlocking segments 310A disposed generally perpendicular to the bending direction Y. In some embodiments, at least two of the plurality of interlocking segments 310A are generally parallel to each other. In one embodiment, every two adjacent interlocking segments 310A have a generally equal spacing along Y axis.

FIG. 6B illustrates another example of an interlocking device 300B disposed on a functional layer 305 of an electronic device. The interlocking device 300B includes a first set of interlocking segments 310B generally parallel to each other, a second set of interlocking segments 314B generally parallel to each other, and a third set of interlocking segments 312B disposed between the first and second sets of interlocking segments. The third set of interlocking segments 312B can be disposed in a bending area providing adequate bending flexibility. FIG. 6C illustrates an example of an interlocking device 300C disposed on a functional layer 305 of an electronic device. The interlocking device 300C includes a plurality of short interlocking segments or individual interlocking elements 310C dispersed on the surface of the functional layer 305, which may allow adequate bonding property and bending flexibility. In some embodiments, the interlocking device 300B includes only two sets of interlocking segments (e.g., 310B and 314B).

FIG. 6D illustrates an example of an interlocking device 300D disposed on a functional layer 305 of an electronic device. The interlocking device 300D comprises a first set of interlocking segments 310D and a second set of interlocking segments 320D. The first set of interlocking segments 310D are disposed approximate to a first edge along X axis of the functional layer 305 and the second set of interlocking segments 320D are disposed approximate to a second edge along X axis of the functional layer 305. The first set of interlocking segments 310D includes two generally parallel interlocking segments 312D. The second set of interlocking segments 320D includes two generally parallel interlocking segments 322D.

FIG. 6E illustrates another example of an interlocking device 300E disposed on a functional layer 305 of an electronic device. The interlocking device 300E comprises a first set of interlocking segments 310E and a second set of interlocking segments 320E. The first set of interlocking segments 310E are disposed approximate to a first edge along X axis of the functional layer 305 and the second set of interlocking segments 320E are disposed approximate to a second edge along X axis of the functional layer 305. The first set of interlocking segments 310E includes two generally parallel interlocking segments 312E disposed on a first side, two generally parallel interlocking segments 314E disposed on a second side, and a set of short interlocking segments 316E disposed between the first side and the second side. The second set of interlocking segments 320E includes two generally parallel interlocking segments 322E disposed on a first side, two generally parallel interlocking segments 324E disposed on a second side, and a set of short interlocking segments or individual interlocking elements 326E disposed between the first side and the second side. In some embodiments, the interlocking device 300E may include only some sets of the interlocking segments illustrated, for example, only the sets of relatively long interlocking segments 312E, 314E, 322E, and 324E.

FIG. 6F illustrates yet another example of an interlocking device 300F disposed on a functional layer 305 of an electronic device. The interlocking device comprises a first set of interlocking segments 310F and a second set of interlocking segments 320F. The first set of interlocking segments 310F are disposed approximate to a first edge along X axis of the functional layer 305 and the second set of interlocking segments 320F are disposed approximate to a second edge along X axis of the functional layer 305. The first set of interlocking segments 310F includes a set of short interlocking segments or individual interlocking elements 312F. The second set of interlocking segments 320F includes a set of short interlocking segments or individual interlocking elements 322F.

EXAMPLES

All parts, percentages, ratios, etc. in the examples are by weight, unless noted otherwise. Solvents and other reagents used were obtained from Sigma-Aldrich Corp., St. Louis, Mo. unless specified differently.

TABLE 1

| Materials | |
|---|---|
| Abbreviation or Trade Designation | Description |
| K-FLEX 188 | Aliphatic polyester polyol, commercially available from King Industries, Norwalk, CT under the trade name "K-FLEX 188" |
| DESMODUR N3300A | Aliphatic polyisocyanate, commercially available from Bayer, Pittsburgh, PA under the trade name "DESMODUR N3300A". |
| DABCO T-12 | Dibutyltin dilaurate catalyst, commercially available from Air Products and Chemicals, Inc., Allentown, PA, under the trade name "DABCO T-12". |
| LmPEN | Low melt polyethylene naphthalate polymer (co-polyester made from 90% NDC (dimethyl-2,6-naphthalenedicarboxylate) and 10% terephthalic acid, extruded and biaxially oriented at 3M |
| ZF-50 | Cyclo-olefin copolymer liner available from Zeon Corp. |

Preparation of the Flexible Component Layer

A 90/10 PEN copolymer (LmPEN) was prepared as illustrated in Example Control B of U.S. Pat. No. 8,263,731. This material was melt extruded using a twin screw extruder with vacuum applied for moisture removal. The melt was heated to 525° F. and delivered to an extrusion die and quenched on a chilled drum. This quenched film was stretched 3.3-1 at a temperature of 235° F.-250° F. in the machine direction and cooled. This machine direction stretched film was fed into a tenter machine which gripped the film edges, heated the film back to 255-300° F. and stretched the film 3.7-1 up to 4.1-1 in the transverse direction. The film was then annealed at 450° F. for 8 to 30 seconds in the same tenter. The film edges were trimmed off and a polyethylene premask applied before the film was wound into roll form.

A primer solution was made by mixing 52.5 grams of VITEL 2200B (Bostik Americas, Wauwatosa, Wis.) in 2447.5 grams of methyl ethyl ketone (Fisher Scientific) to make a homogeneous solution. The primer solution was applied to corona treated 50 micrometer thick LmPEN films in a roll to roll process where the primer solution was metered through a slot die onto the moving web. Thickness was controlled by the use of a metering pump and a mass flow meter. The volatile components of the coating were then dried in a 3 zone air floatation zone oven (ovens temperatures set all set to 175° F.). The dried coating was then wound into a roll and the primer coating had a thickness of approximately 81 nanometers.

In a standard mixer equipped with low shear blade was placed 200 lbs. of K-FLEX 188 and 42 grams of DABCO T-12. The components were mixed under vacuum for 4 hours at 70° C. and 28 inches of mercury to eliminate dissolved gases in the resin. The resulting Polyol with catalyst was placed into 5 gallon pails for later use.

In a standard mixer equipped with low shear blade was placed 200 lbs. of DESMODUR N330. The component was mixed under vacuum for 4 hours at 140° F. and 28 inches of mercury to eliminate dissolved gases in the resin. The resulting resin was placed into 5 gallon pails for later use.

To fabricate the flexible component layer, the Polyol with catalyst and DESMODUR N3300 were added to separate pumps carts with mass flow controllers. The Polyol with catalyst was heated to 60 degrees C. to lower the viscosity. The two components were delivered in controlled stoichiometry from the pump carts via mass flow control to a Kenics static mixer (355 mm long, with 32 elements). The mass flow rate for the Polyol with catalyst and DESMODUR N3300 were to 43.0 g/min and 32.8 g/min respectively to give an overall target NCO/OH ratio for the polyurethane reactive mixture of 0.9. The 2-part polyurethane reactive mixture was coated between a 12" ZF-50 liner and the primed LmPEN film described above. The reactive mixture was placed as polyurethane coatings of the desired thickness between the films in a continuous fashion. The completed flexible component layer was heated at elevated temperature on hot platens to gel the polyurethane film and was placed into a 70 degrees C. oven for 16 hours to cure.

Preparation of Interlocking Devices

Three sets of interlocking devices, as described in FIG. 5K, were manufactured through a profile extrusion process with Polypropylene (Extrusion Grade Pro-fax available from LyondellBasell Industries, Rotterdam, Netherlands), and cut to a length of 76 mm. The interlocking features include alternating, continuous 1.96 mm and 1.35 mm tall posts, each with a 1.32 mm wide mushroom style cap. The nominal thickness of the cap was 0.35 mm. The nominal thickness of the stem was 0.40 mm. The stems where spaced nominally 2.02 mm apart across the construction. The final interlocking device dimensions are 17 mm×76 mm×2.30 mm.

Assembly of Electronic Device I

The representative electronic device, Electronic Device I, includes two coplanar plates, where one of the plates is fixed and the other plate rotates to be overlapping and facing each other. The gap between the plates when closed was set to approximately 9 mm. These plates represent the rigid device elements. Electronic Device I uses a fixed bonding system. The 16 mm×78 mm×1.56 mm polycarbonate shim was attached to the first rigid device element by a layer of 468MP adhesive transfer tape (available from 3M Company, St. Paul, Minn.).

7"×0.625" pieces of the flexible component layer prepared above were cut using a rotary cutter and the liners were removed. There was a free zone approximately 12.5 mm wide on either side of the pivot axis where the flexible component layer was unconstrained. An additional layer of 468MP Adhesive attached the 7"×0.625" flexible component layer to the polycarbonate shim. The flexible component layer was attached to the second rigid device element with a single layer of Scotch double sided permanent adhesive tape (available from 3M Company, St. Paul, Minn.).

Assembly of Electronic Device II with Interlocking Device

The representative electronic device, Electronic Device II, includes two coplanar plates, where one of the plates is fixed and the other plate rotates to be overlapping and facing each other. The gap between the plates when closed was set to approximately 9 mm. These plates represent the rigid device elements. Three interlocking devices (17 mm×76 mm×1.26 mm) were also mounted on the fixed plate using the same 5 mil thick 468MP adhesive transfer tape. The minimum spacing between the fixed plate and the interlocking devices/shims was 7.44 mm.

7"×0.625" pieces of the flexible component layer prepared above were cut using a rotary cutter and the liners were removed. There was a free zone approximately 12.5 mm wide on either side of the pivot axis where the flexible component layer was unconstrained. An additional layer of 468MP Adhesive attached the 7"×0.625" flexible component layer to the interlocking device. The other side of the flexible component layer was attached to the second rigid device element with a single layer of Scotch double sided permanent adhesive tape (available from 3M Company, St. Paul, Minn.).

Dynamic Fold Testing

The durability of the flexible component layer to multiple folding events was evaluated using a dynamic fold tester. The folding rate was set to approximately 20 folds/min and the test run for 108848 cycles. The Electronic Device I and Electronic Device II were visually inspected for evidence of failure such as coating cracking, delamination or haze. The Electronic Device II having the interlocking devices were observed to move back and forth by a few mm each time the folder opened and closed. The results of fatigue test comparing Electronic Device I and Electronic Device II are shown in Table 2. The mean cycles to failure of Electronic Device II was almost twice as large as Electronic Device I. In all cases the failure mode was complete breakage of the flexible component layer into two pieces.

TABLE 2

Results of dynamic folding fatigue test

| Sample | Cycle count when failure was first observed | |
|---|---|---|
| | Electronic Device I | Electronic Device II |
| Replicate A | 4749 | 28707 |
| Replicate B | 28707 | 71101 |
| Replicate C | 71101 | 108848 |
| Mean cycles to failure | 34852 | 69552 |

EXEMPLARY EMBODIMENTS

Embodiment A1. An electronic device, comprising: at least one rigid member; a flexible component layer having at least two sections when the flexible component layer is flexed; and an interlocking device disposed between the flexible component layer and one of the at least one rigid member, wherein the interlocking device comprises a first interlocking component attached to or integrated with the flexible component layer, and a second interlocking component attached to or integrated with one of the at least one rigid member configured to engage with the first interlocking component, such that the engagement prevents the separation of the flexible component layer from the at least one rigid member along a direction generally perpendicular to a surface of the at least one rigid member.

Embodiment A2. The electronic device of Embodiment A1, wherein the entirety of the flexible component layer is within the boundary of the at least one rigid member when the flexible component layer is flexed.

Embodiment A3. The electronic device of Embodiment A1 or A2, wherein a part of the flexible display is outside of the boundary of the at least one rigid member when the flexible component layer is flexed.

Embodiment A4. The electronic device of any one of Embodiment A1-A3, wherein the flexible component layer comprises three sections forming an S-shape when the flexible component layer is flexed.

Embodiment A5. The electronic device of any one of Embodiment A1-A4, wherein the at least one rigid member comprises two separate rigid components coupled together by a hinge mechanism.

Embodiment A6. The electronic device of any one of Embodiment A1-A5, wherein the at least one rigid members comprises a continuous rigid support, the continuous rigid support comprising two rigid components.

Embodiment A7. The electronic device of Embodiment A6, wherein the one continuous rigid support is bendable, but is stiffer than the flexible component layer.

Embodiment A8. The electronic device of Embodiment A6, wherein the one continuous rigid support comprises one bendable section interconnecting with the two rigid components.

Embodiment A9. The electronic device of any one of Embodiment A1-A8, wherein at least one of the first and the second interlocking components comprises a plurality of engagement elements.

Embodiment A10. The electronic device of Embodiment A9, wherein at least some of the plurality of engagement elements form a sliding channel.

Embodiment A11. The electronic device of Embodiment A9, wherein at least one of the plurality of the engagement elements has a cross-sectional shape having a stem and a cap wider than the stem.

Embodiment A12. The electronic device of any one of Embodiment A1-A11, wherein at least one of the first and the second interlocking components comprises a plurality of engagement rails.

Embodiment A13. The electronic device of Embodiment A12, wherein at least one of the engagement rails extends from the flexible component layer along an axis slanted from the flexible component layer.

Embodiment A14. The electronic device of Embodiment A12, wherein at least one of the engagement rails has a cross-sectional shape having a stem and a cap.

Embodiment A15. The electronic device of Embodiment A12, wherein at least some of the engagement rails has one or more slits.

Embodiment A16. The electronic device of Embodiment A12, wherein the plurality of engagement rails comprises a first set of engagement rails extending from the flexible component layer along a first axis slanted from the flexible component layer and a second set of engagement rails extending from the first or second layer along a second axis slanted from the at least one rigid element, and wherein the first axis is not parallel to the second axis.

Embodiment A17. The electronic device of any one of Embodiments A1-A16, wherein the first interlocking component comprises a set of first engagement elements and the second interlocking component comprises a set of second engagement elements.

Embodiment A18. The electronic device of Embodiment A17, wherein the first engagement elements have generally same shapes as the second engagement elements.

Embodiment A19. The electronic device of any one of Embodiments A1-A18, wherein the flexible component layer has an X axis and a Y axis generally perpendicular to the X axis, wherein the flexible component layer is configured to bend about the Y axis.

Embodiment A20. The electronic device of Embodiment A19, wherein the interlocking device is disposed along the X axis.

Embodiment A21. The electronic device of Embodiment A19, wherein the interlocking device comprises a first interlocking segment and a second interlocking segment, wherein the first interlocking segment is disposed approximate to a first edge along X axis of the flexible component layer and the second interlocking segment is disposed approximate to a second edge along X axis of the flexible component layer.

Embodiment A22. The electronic device of Embodiment A19, wherein the interlocking device comprises a plurality of interlocking segments.

Embodiment A23. The electronic device of Embodiment A22, wherein the plurality of interlocking segments are disposed in a pattern.

Embodiment A24. The electronic device of Embodiment A22, wherein at least two of the plurality of interlocking segments are generally parallel to each other.

Embodiment A25. The electronic device of Embodiment A22, wherein the plurality of interlocking segments are disposed with generally equal spacing along X axis and Y axis.

Embodiment A26. The electronic device of any one of Embodiment A1-A25, further comprising adhesives disposed between the flexible component layer and one of the at least one rigid member, between the flexible component layer and the interlocking device, and/or between interlocking device and one of the at least one rigid member.

Embodiment A27. The electronic device of at least one of Embodiment A1-A26, wherein the interlocking device further comprises a coupling material.

Embodiment A28. The electronic device of Embodiment A27, wherein the couple material facilitates heat transfer from the flexible component layer to the at least one rigid member.

Embodiment A29. The electronic device of Embodiment A27, wherein the coupling material comprises at least one of metallic, dielectric and ferromagnetic materials.

Embodiment A30. The electronic device of Embodiment A27, wherein the coupling material comprises at least one of water, deionized water, glycol solutions, water solutions, and thermal grease.

Embodiment A31. The electronic device of Embodiment A27, wherein the coupling material has a thermal conductivity in a range of 0.02 W/m·K to 0.6 W/m·K.

Embodiment A32. The electronic device of Embodiment A27, wherein the coupling material has a thermal conductivity in a range of 0.02 W/m·K to 4.1 W/m·K.

Embodiment A33. The electronic device of Embodiment A27, wherein the coupling material has a viscosity in a range of 5,000 cP to 10,000 cP.

Embodiment A34. The electronic device of any one of Embodiment A1-A33, wherein the flexible component layer is a flexible display.

Embodiment A35. The electronic device of any one of Embodiment A1-A34, wherein the interlocking device has a height no more than 10 mm.

Embodiment A36. The electronic device of any of Embodiment A1-A34, wherein the interlocking device has a height no more than 10 micrometers.

Embodiment A37. The electronic device of any of Embodiment A1-A36, wherein the flexible component layer comprises a heat spreader layer.

Embodiment A38. The electronic device of any of Embodiment A27, wherein the coupling material comprises thermal conductive particles.

The present invention should not be considered limited to the particular examples and embodiments described above, as such embodiments are described in detail to facilitate explanation of various aspects of the invention. Rather the present invention should be understood to cover all aspects of the invention, including various modifications, equivalent processes, and alternative devices falling within the spirit and scope of the invention as defined by the appended claims and their equivalents.

What is claimed is:

1. An electronic device, comprising:
    at least one rigid member;
    a flexible component layer having at least two sections when the flexible component layer is flexed; and
    an interlocking device disposed between the flexible component layer and one of the at least one rigid member,
    wherein the interlocking device comprises a first interlocking component attached to or integrated with the flexible component layer, and a second interlocking component attached to or integrated with one of the at least one rigid member configured to engage with the first interlocking component, such that the engagement prevents the separation of the flexible component layer from the at least one rigid member along a direction generally, perpendicular to a surface of the at least one rigid member,
    wherein the first interlocking component is adapted to slide, along a sliding axis, with respect to the second interlocking component proximate a center of the electronic device as measured along an axis perpendicular to the sliding axis.

2. The electronic device according to claim 1, wherein the at least one rigid member comprises two rigid components coupled together by a hinge mechanism.

3. The electronic device according to claim 1, wherein the interlocking device further comprises a coupling material.

4. The electronic device according to claim 3, wherein the coupling material has a thermal conductivity in a range of 0.02 W/m·K to 3.0 W/m·K.

5. The electronic device according to claim 3, wherein the coupling material has a viscosity in a range of 5,000 cP to 10,000 cP.

6. The electronic device according to claim 3, wherein the coupling material comprises at least one of metallic, dielectric and ferromagnetic materials.

7. The electronic device according to claim 1, wherein the first or the second interlocking component comprises a plurality of engagement elements.

8. The electronic device according to claim 1, wherein at least one of the plurality of engagement rails comprises a stem and a cap that is wider than the stem.

9. The electronic device according to claim 1, wherein at least some of the engagement elements form a sliding channel.

10. The electronic device according to claim 1, wherein the first or the second interlocking component comprises a plurality of engagement rails.

11. The electronic device according to claim 10, wherein at least one of the engagement rails extends from the flexible component layer or the rigid member along an axis slanted from the corresponding element.

* * * * *